United States Patent
Zhao et al.

(10) Patent No.: US 11,995,385 B1
(45) Date of Patent: May 28, 2024

(54) MATCHING DESIGN METHOD OF STATIC STIFFNESS FOR COMBINED BOX BODY STRUCTURE OF LARGE REDUCER

(71) Applicant: University of Shanghai for Science and Technology, Shanghai (CN)

(72) Inventors: Lihui Zhao, Shanghai (CN); Dongdong Zhang, Shanghai (CN); Shuo Weng, Shanghai (CN); Jinzhi Feng, Shanghai (CN); Kang Du, Shanghai (CN); Zhen Wang, Shanghai (CN)

(73) Assignee: University of Shanghai for Science and Technology, Shanghai (CN)

( * ) Notice: Subject to any disclaimer, the term of this patent is extended or adjusted under 35 U.S.C. 154(b) by 0 days.

(21) Appl. No.: 18/413,856

(22) Filed: Jan. 16, 2024

(30) Foreign Application Priority Data

Mar. 9, 2023 (CN) .......................... 202310221324.7

(51) Int. Cl.
*G06F 30/20* (2020.01)

(52) U.S. Cl.
CPC .................................... *G06F 30/20* (2020.01)

(58) Field of Classification Search
CPC .......... G06F 30/00; G06F 30/20; G06F 30/22; G06F 30/23; G06F 30/25; G06F 30/27; G06F 30/30
USPC ....................................................... 703/1, 2
See application file for complete search history.

(56) References Cited

U.S. PATENT DOCUMENTS

| 9,501,805 | B2 * | 11/2016 | McLean | ................. | G06Q 10/06 |
| 11,881,855 | B2 * | 1/2024 | Ren | ........................ | H10N 69/00 |
| 2022/0215143 | A1 * | 7/2022 | Nakhjavani | ............. | G06F 30/17 |

FOREIGN PATENT DOCUMENTS

| CN | 104156501 | 11/2014 |
| CN | 104408254 | 3/2015 |
| CN | 105005673 | 10/2015 |
| CN | 106951610 | 7/2017 |
| CN | 110399675 | 11/2019 |

(Continued)

OTHER PUBLICATIONS

Search report from SIPO in application No. 202310221324.7 dated Jul. 17, 2023.
Notification to Grant Patent Right for Invention from SIPO in application No. 202310221324.7 dated Jul. 18, 2023.

(Continued)

*Primary Examiner* — Hai L Nguyen
(74) *Attorney, Agent, or Firm* — Pilloff Passino & Cosenza LLP; Rachel K. Pilloff; Sean A. Passino

(57) ABSTRACT

A matching design method of static stiffness for a combined box body structure of a large reducer is provided, including the following steps, building a transmission system model and an initial structure model and obtaining load data; performing a statics analysis; obtaining primary design variables and design responses; constructing design variables; constructing a static stiffness matching target of a combined box body; constructing an objective function; setting constraint conditions; constructing a response surface proxy model; constructing a static stiffness matching optimization model of combined box body; obtaining optimal design variables and obtaining an optimal structure model of the box body; performing the statics analysis on the optimal structure model of the box body, and performing a contrastive analysis with statics analysis results of the corrected box body two-dimensional unit finite element model to confirm optimization effects.

7 Claims, 10 Drawing Sheets

(56) References Cited

FOREIGN PATENT DOCUMENTS

| | | |
|---|---|---|
| CN | 112417736 | 2/2021 |
| CN | 113158519 | 7/2021 |
| CN | 115438543 | 12/2022 |

OTHER PUBLICATIONS

Zhao Jingshun, et al., Zhao Jingshun et al., Optimization Design of Reducer Box Parameters Based on Proxy Model, Agricultural Equipment and Vehicle Engineering, vol. 61, Issue 2, 22, pp. 156-159, Feb. 2023.

Lian Mingxuan, Research on Nonlinear Dynamic Characteristics and Parameters Optimization of Automotive Transmission, found in Full-text Database of Excellent Doctoral Dissertations in China, No. 3 Northeastern University, 2017 (English language abstract on pp. III-IV).

\* cited by examiner

MATCHING DESIGN METHOD OF STATIC STIFFNESS FOR COMBINED BOX BODY STRUCTURE OF LARGE REDUCER

CROSS-REFERENCE TO RELATED APPLICATIONS

This application claims priority to Chinese Patent Application No. 202310221324.7, filed on Mar. 9, 2023, the contents of which are hereby incorporated by reference.

TECHNICAL FIELD

The application relates to the technical field of stiffness matching design of a reducer box structure, and in particular to a matching design method of static stiffness for a combined box body structure of a large reducer.

BACKGROUND

As the supporting structure of transmission system, the performance of reducer box body has an important influence on the performance and life of reducer. The reducer box body structure of a large-scale device such as a ship mostly adopts a combined box body composed of different box body structures. The load generated by the gear transmission system during the operation of the reducer is transmitted to the bearing seat of the box body through the gear shaft, which makes the box body deform. The lack of stiffness of the reducer box body will make it easy to deform, which will adversely affect the operation of the gear transmission system, thus leading to the decline of the transmission accuracy of the whole transmission system, causing the vibration, impact and fatigue failure of the gear and reducing the working performance of the reducer. For combined box body structure, different box body structures need to bear independent or synthetic working loads of different transmission stages. When the stiffness matching degree of each part of the combined box body is insufficient, the structure deformation of each part of the combined box body is not harmonious under the working load of the transmission system, which will cause more severe vibration and impact of the transmission system, seriously affect the normal work of the reducer and other structures, and even fail. In addition, with the development trend of lightweight design of the device, the lightweight design of reducer box body also puts forward higher requirements for the stiffness design. Therefore, it is of great engineering significance to carry out the stiffness matching design of combined box body structure to ensure the high performance and high reliability of transmission system.

The reducer box body is a mechanical part with complex structure characteristics, and the design work is relatively complicated and difficult. For the development and design of new reducer box body, the empirical analogy design is often carried out on the basis of the existing design, which may greatly reduce the tedious design labor of designers, but there are some problems such as large design margin, low material utilization rate and vague design objectives. For the combined box body structure of large-scale device transmission system, empirical analogy design often adopts larger design margin, and the design objectives of stiffness and strength of each part of the box body are more vague, so it is difficult to achieve lightweight design under the comprehensive performance requirements. It can be seen that it is necessary to carry out the static stiffness matching design of large-scale combined reducer box body under the requirement of lightweight design. Therefore, in order to solve the problems that the static stiffness matching design objective is vague and the materials are difficult to be made full use of in the structure design of the combined box body of large reducer, this application puts forward the construction and design method of the static stiffness matching design objective of the combined box body, which provides a guiding design method for the box body design of large-scale installed reducer in China.

SUMMARY

The objective of the application is to provide a matching design method of static stiffness for a combined box body structure of a large reducer, so as to solve the above problems and achieve the objectives of ensuring the accurate transmission of the transmission system, improving the efficiency and service life of the transmission system and making the reducer box work stably in use.

In order to achieve the above objectives, the application provides the following scheme: a matching design method of static stiffness for a combined box body structure of a large reducer, comprising following steps:

S1, building a transmission system model, building an initial structure model of a combined box body based on the transmission system model, building and correcting a box body two-dimensional unit finite element model based on the initial structure model of the combined box body, obtaining load data of the transmission system model, and building a coordinate system;

S2, based on the load data and a corrected box body two-dimensional unit finite element model, performing a statics analysis to obtain a static displacement in each of directions at a center point of each of bearing seats of the corrected box body two-dimensional unit finite element model;

S3, obtaining primary design variables and design responses based on the corrected box body two-dimensional unit finite element model;

S4, based on the primary design variables, constructing design variables of a static stiffness matching optimization of the combined box body;

S5, based on the static displacement in each of the directions at the center point of each of the bearing seats of the corrected box body two-dimensional unit finite element model and the initial structure model of the combined box body, constructing a static stiffness matching target of the combined box body;

S6, constructing an objective function based on the static stiffness matching target of the combined box body and the design responses;

S7, setting constraint conditions; constructing a response surface proxy model based on the design variables of the static stiffness matching optimization of the combined box body and the design responses;

S8, based on the objective function, the design variables of the static stiffness matching optimization of the combined box body, the constraint conditions and the response surface proxy model, forming a static stiffness matching optimization model of the combined box body;

S9, based on the static stiffness matching optimization model of the combined box body, adopting a multi-objective genetic algorithm to obtain an optimal design variable, and obtaining an optimal structure model of a box body based on the optimal design variable; and S10, performing a statics analysis on the optimal structure model of the box body, and performing a contrastive analysis with statics analysis results of the corrected box body two-dimensional unit finite element model to confirm optimization effects.

Preferably, in the S1, a method for obtaining the load data comprises following steps:

S101, applying working condition data to the transmission system model;

S102, performing a statics analysis on the transmission system model, and obtaining component forces of the transmission system in the X, Y and Z directions acting on a center position of each of bearings under the working condition data based on the coordinate system; and S103, based on the box body two-dimensional unit finite element model, solving a modal and a natural frequency, compared with a modal and a natural frequency of the initial structure model of the combined box body, and correcting the box body two-dimensional unit finite element model to obtain the corrected box body two-dimensional unit finite element model.

Preferably, in the S2, a method for obtaining the static displacement in each of the directions at the center point of each of the bearing seats of the corrected box body two-dimensional unit finite element model comprises following steps:

S201, after respectively applying the component forces of the transmission system in the X, Y and Z directions acting on the center position of each of the bearings under the working condition data to a bearing seat center of a corresponding position of the corrected box body two-dimensional unit finite element model, obtaining the static displacement value in each of the directions at the center point of each of the bearing seats of the corrected box body two-dimensional unit finite element model based on the static analysis of the corrected box body two-dimensional unit finite element model.

Preferably, in the S3, a construction of the primary design variables and the design responses comprises following steps:

S301, based on the corrected box body two-dimensional unit finite element model, selecting thickness variables of each part of a model as the primary design variables; and S302, based on the corrected box body two-dimensional unit finite element model, selecting the static displacement value in each of the directions at the center point of each of the bearing seats of the corrected box body two-dimensional unit finite element model and box mass as design responses.

Preferably, in the S4, a construction of the design variables comprises following steps:

S401, based on the primary design variables, the design responses and the corrected box body two-dimensional unit finite element model, performing a sensitivity analysis of the design responses to the primary design variables, and obtaining a sensitivity value of each of the design responses to the primary design variables; and S402, sorting the sensitivity value of the each of the design responses to the primary design variables respectively, selecting first five sensitivity values of the each of the design responses to the primary design variables after a sorting, and combining the primary design variables corresponding to the sensitivity values to form the design variables of the static stiffness matching optimization of the combined box body.

Preferably, in the S5, constructing the static stiffness matching target of the combined box body comprises following steps:

S501, based on the corrected box body two-dimensional unit finite element model, setting a cartesian coordinate system, constructing a broken line $L_1^x$ in an X direction connecting the center point of each of the bearing seats of an input shaft of a transmission system, and constructing a broken line $L_1^z$ in a Z direction connecting the center point of each of the bearing seats of the input shaft of the transmission system; constructing a broken line $L_2^x$ in the X direction connecting the center point of each of the bearing seats on an intermediate shaft and an output shaft of the transmission system, and constructing a broken line $L_2^z$ in the Z direction connecting the center point of each of the bearing seats on the intermediate shaft and the output shaft of the transmission system;

S502, based on the initial structure model of the combined box body, obtaining nominal distances $D^x$ and $D^z$ among the input shaft, the intermediate shaft and the output shaft in the X direction and the Z direction in a nominal design state of the transmission system; and S503, based on a static displacement value in each of the directions at the center point of each of the bearing seats of the corrected box body two-dimensional unit finite element model, obtaining a minimum distance $d_{min}^x$ and a maximum distance $d_{max}^x$ between the two broken lines $L_1^x$ and $L_2^x$, and obtaining a minimum distance $d_{min}^z$ and a maximum distance $d_{max}^z$ between the two broken lines $L_1^z$ and $L_2^z$;

the static stiffness matching target of the combined box body are constructed as follows:

$$L_1^x // L_2^x$$

$$L_1^z // L_2^z$$

$$d_{min}^x \geq 0.8D^x, d_{max}^x \leq 1.2D^x$$

$$d_{min}^z \geq 0.8D^z, d_{max}^z \leq 1.2D^z$$

Preferably, in the S6, a construction of the objective function comprises following steps:

S601, based on the static stiffness matching target of the combined box body, converting $L_1^x // L_2^x$ in the static stiffness matching target of the combined box body into a weighted sum of absolute values of a maximum static displacement in the design responses on the input shaft, the intermediate shaft and the output shaft in a minimum X direction; converting $L_1^z // L_2^z$ in the static stiffness matching target of the combined box body into a weighted sum of the absolute values of a maximum static displacement in the design responses on the input shaft, the intermediate shaft and the output shaft in a minimum Z direction; forming the two weighted sums of the absolute values into the two objective functions;

S602, based on proportional values of the absolute values of the maximum static displacement in each of the design responses on the input shaft, the intermediate shaft and the output shaft in the X direction, and setting a sum of weighting coefficients as 1, and setting each of the weighting coefficients according to a proportional relationship; and S603, based on proportional values of the absolute values of the maximum static displacement in each of the design responses on the input shaft, the intermediate shaft and the output shaft in the Z direction, and setting a sum of weighting coefficients as 1, and setting each of the weighting coefficients according to the proportional relationship.

Preferably, in the S7, a construction of the constraint conditions comprises following steps:

S701, based on the design variables of the static stiffness matching optimization of the combined box body, constructing a change range constraint of the design variables of the static stiffness matching optimization of the combined box body to obtain a design variable constraint;

S702, based on $d_{min}^x \geq 0.8D^x$, $d_{max}^x \leq 1.2D^x$, $D_{min}^z \geq 0.8D^z$, $d_{max}^z \leq 1.2D^z$ in the static stiffness matching target of the combined box body, extracting the design responses related to the objective function except the objective function, and constructing a design response threshold constraint; constructing other design response threshold constraints based on the static stiffness matching target $L_1^x//L_2^x$ and $L_1^z//L_2^z$ of the combined box body;

S703, based on mass of the corrected box body two-dimensional unit finite element model, obtaining a mass design response constraint by setting a mass threshold; and S704, taking the mass design response constraint, the design variable constraint and the design response threshold constraint as the constraint conditions.

Preferably, in the S7, a method for constructing the response surface proxy model comprises following steps:

S711, based on the design variables of the static stiffness matching optimization of the combined box body, constructing sampling samples by using a Latin hypercube sampling method;

S712, based on the sampled samples and the corrected box body two-dimensional unit finite element model, performing a static stiffness analysis to obtain design response values;

S713, based on the sampling samples and the design response values, constructing the response surface proxy model of the design variables and the design responses by using a least square method; and S714, performing an accuracy test by a fitting optimization index method, and obtaining a feasible response surface proxy model.

The application has the following technical effects: aiming at the matching problem of the static stiffness of the combined box body of the large reducer, the application provides a matching design method, which considers the uncertainty of the displacement parameters at the bearing seat of the box body, especially the matching problem between different broken lines, so as to realize the coordination between different broken lines of the box body, and the combined box body of the large reducer may work stably through the technical scheme.

BRIEF DESCRIPTION OF THE DRAWINGS

In order to explain the embodiments of the present application or the technical scheme in the prior art more clearly, the drawings needed in the embodiments will be briefly introduced below. Obviously, the drawings in the following description are only some embodiments of the present application. For ordinary people in the field, other drawings may be obtained according to these drawings without paying creative labor.

DETAILED DESCRIPTION OF THE EMBODIMENTS

In the following, the technical scheme in the embodiment of the application will be clearly and completely described with reference to the attached drawings. Obviously, the described embodiment is only a part of the embodiment of the application, but not the whole embodiment. Based on the embodiments in the present application, all other embodiments obtained by ordinary technicians in the field without creative labor belong to the scope of protection of the present application.

In order to make the above objectives, features and advantages of the present application more obvious and easy to understand, the present application will be further described in detail with the attached drawings and specific embodiments.

Embodiment 1

Figure 1:
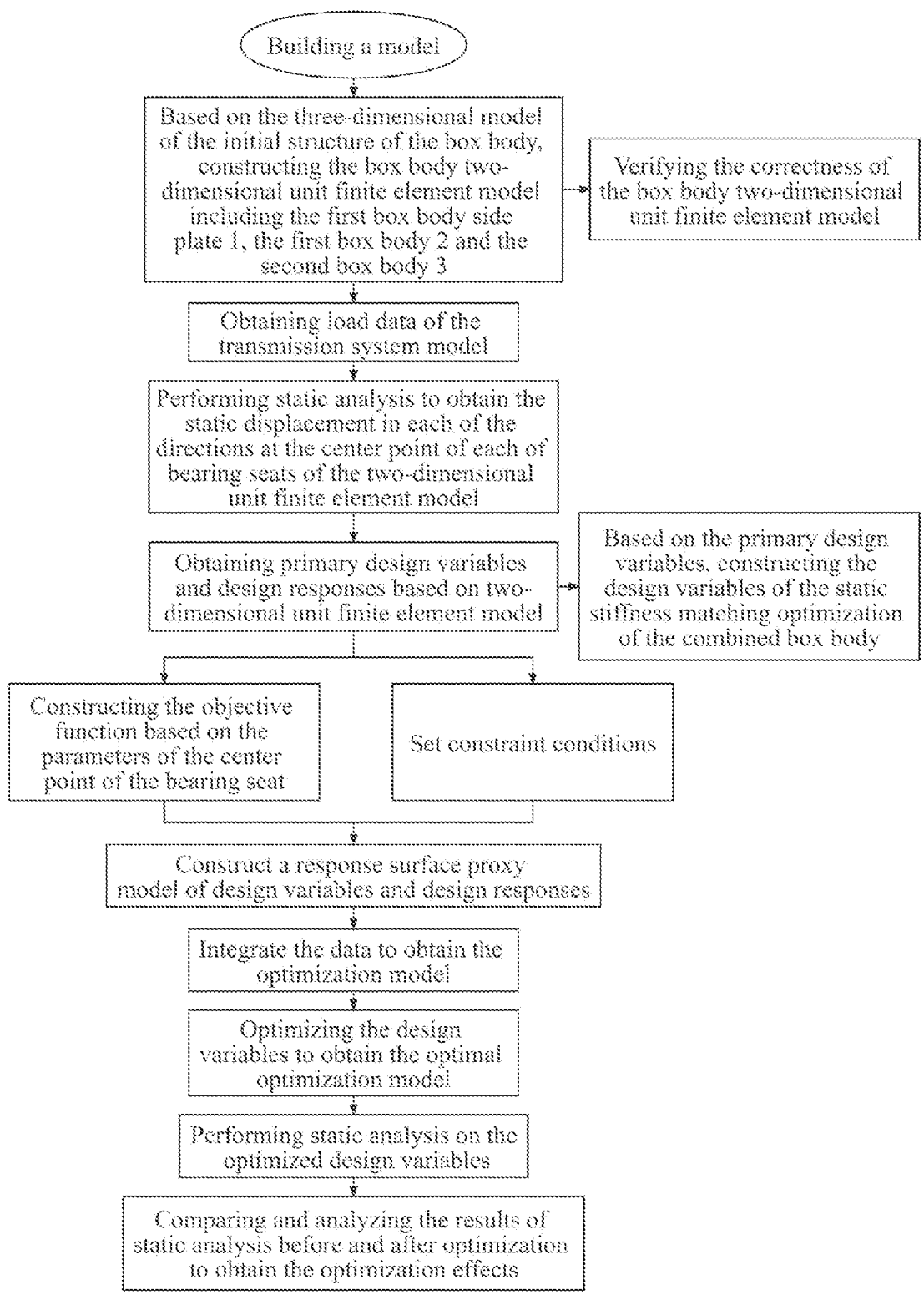
FIG. 1 is a schematic flow chart of the matching design method of static stiffness of the present application.

Referring to FIG. 1, this embodiment provides a matching design method of static stiffness for a combined box body structure of a large reducer, which includes the following steps.

S1, building a transmission system model, building an initial structure model of a combined box body based on the transmission system model, building and correcting a box body two-dimensional unit finite element model based on the initial structure model of the combined box body, obtaining load data of the transmission system model, and building a coordinate system;

S2, based on the load data and a corrected box body two-dimensional unit finite element model, performing a statics analysis to obtain a static displacement in each of directions at a center point of each of bearing seats of the corrected box body two-dimensional unit finite element model;

S3, obtaining primary design variables and design responses based on the corrected box body two-dimensional unit finite element model;

S4, based on the primary design variables, constructing design variables of a static stiffness matching optimization of the combined box body;

S5, based on the static displacement in each of the directions at the center point of each of the bearing seats of the corrected box body two-dimensional unit finite element model and the initial structure model of the combined box body, constructing a static stiffness matching target of the combined box body;

S6, constructing an objective function based on the static stiffness matching target of the combined box body and the design responses;

S7, setting constraint conditions; constructing a response surface proxy model based on the design variables of the static stiffness matching optimization of the combined box body and the design responses;

S8, based on the objective function, the design variables of the static stiffness matching optimization of the combined box body, the constraint conditions and the response surface proxy model, forming a static stiffness matching optimization model of the combined box body;

S9, based on the static stiffness matching optimization model of the combined box body, adopting a multi-objective genetic algorithm to obtain an optimal design variable, and obtaining an optimal structure model of a box body based on the optimal design variable; and S10, performing a statics analysis on the optimal structure model of the box body, and performing a contrastive analysis with statics analysis results of the corrected box body two-dimensional unit finite element model to confirm optimization effects.

Figure 2:
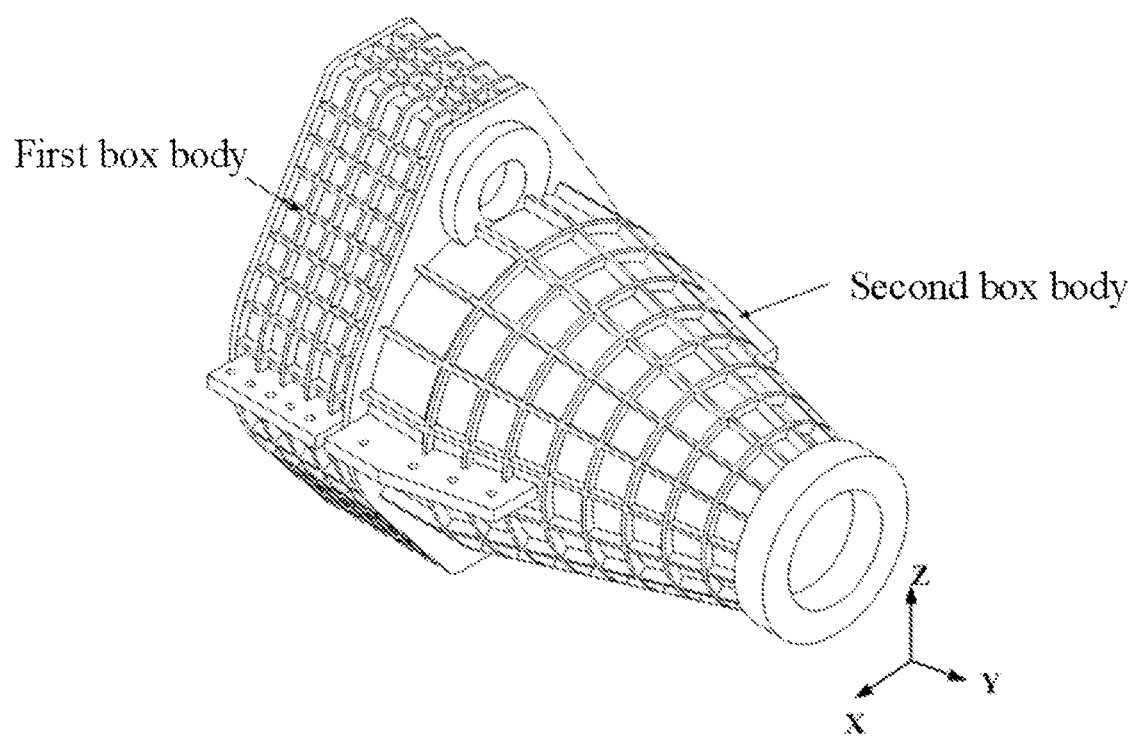
FIG. 2 is a schematic structure diagram of the reducer box body of the present application.
Figure 3:
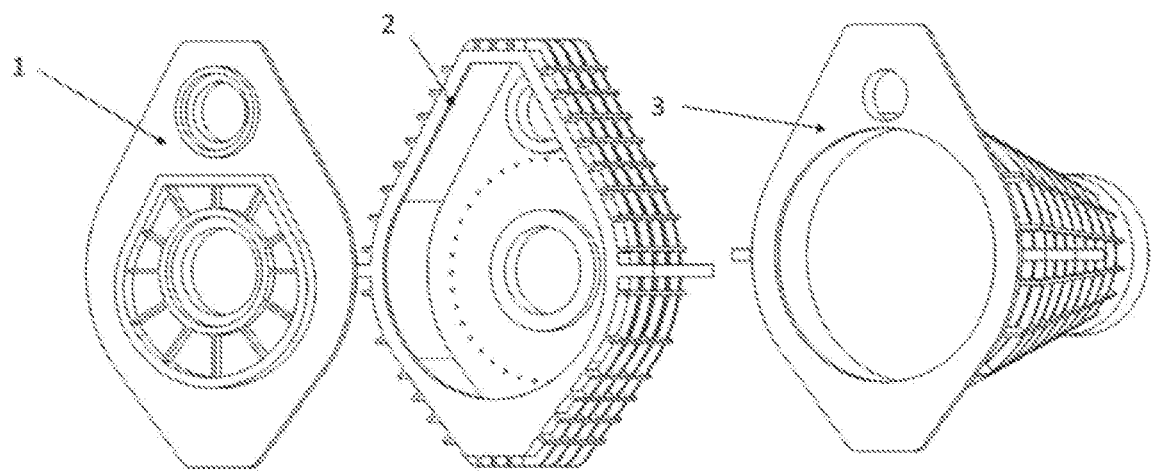
FIG. 3 is an explosion diagram of the reducer combined box body structure of the present application.
Figure 4:
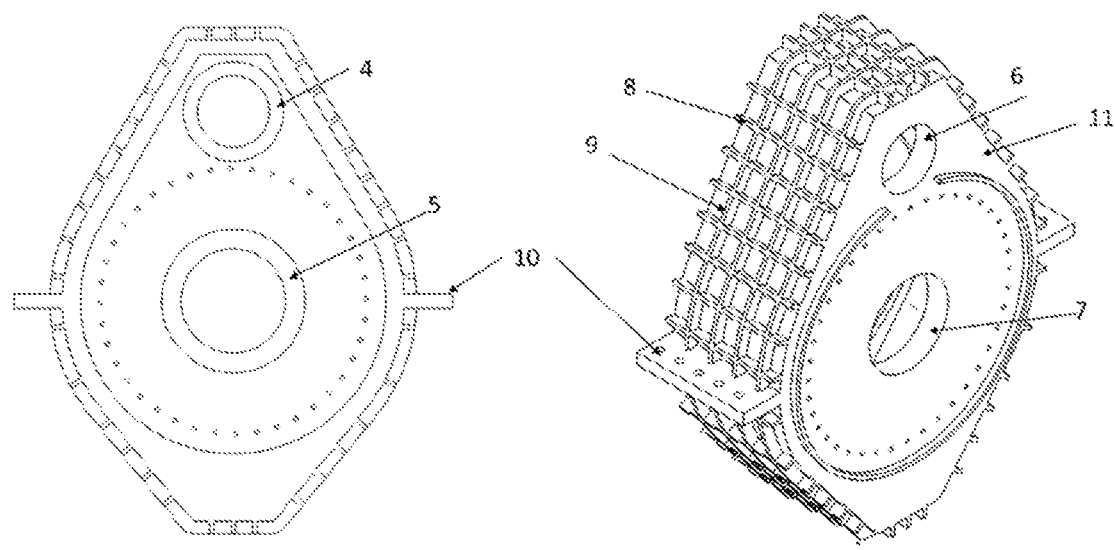
FIG. 4 is a schematic structure diagram of the first box body of the present application.
Figure 5:
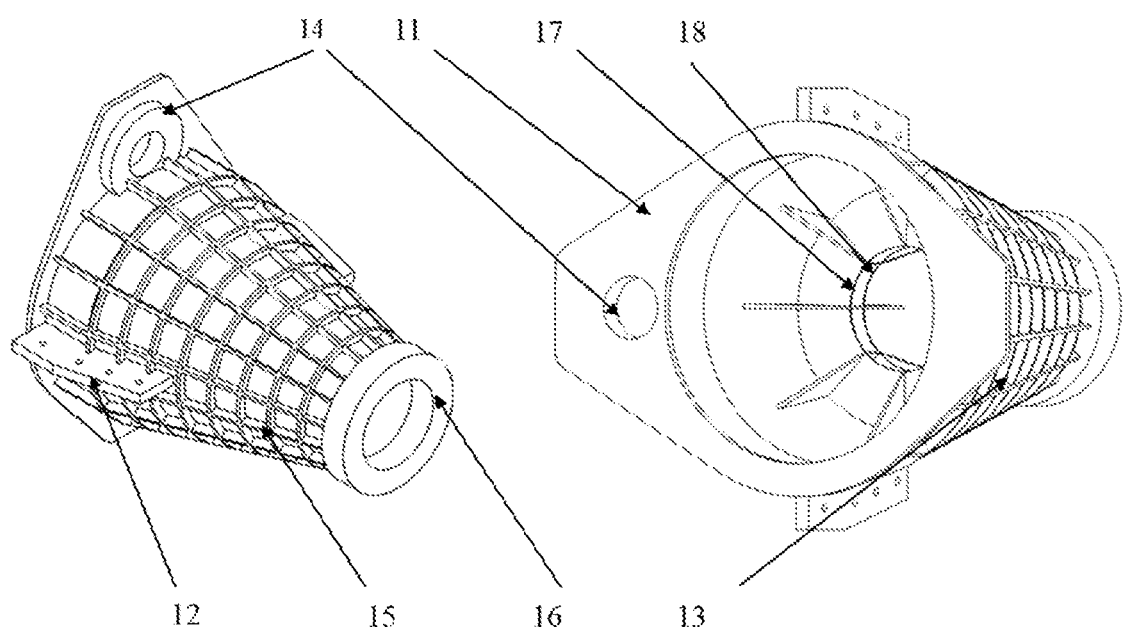
FIG. 5 is a schematic structure diagram of the second box body of the present application.

As shown in FIG. 2, the combined box body of large reducer described in this embodiment is composed of two parts. The box structure mainly consists of a first box body and a second box body, wherein the first box body mainly bears the gear system of the input shaft and the intermediate shaft, and the second box body mainly bears the planetary gear system and the output end, and the first box body and second box body are connected by bolts; the normal and stable operation of the transmission system may only be ensured by the deformation coordination of the first box body and the second box body under the load.

Figure 6:
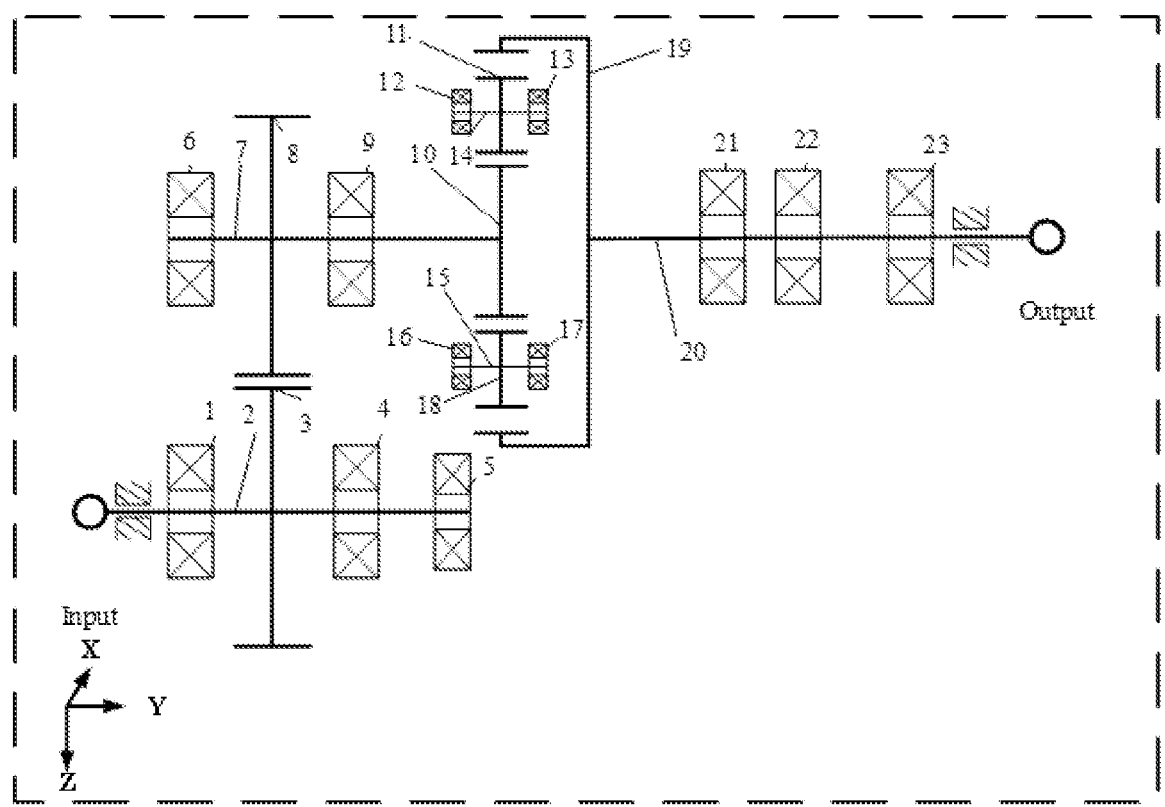
FIG. 6 is a schematic diagram of the transmission system of the reducer of the present application.

As shown in FIG. 6, the transmission system in the reducer is a gear transmission system. The gear transmission system includes an input shaft gear, an intermediate shaft gear, an output shaft gear ring, a transmission shaft, a planetary carrier and planetary gears. Bearings are installed in each of bearing seats of first box body and second box body.

As shown in FIG. 2, the Cartesian coordinate system is defined. The end face of the bearing seat of the output shaft is a circle with its center point as the center of the circle, the X and Z directions are two radial directions passing through the center of the circle, and Y is the axial direction. The XZ plane is set to be parallel to the plane of the circle, and X direction is set to be horizontal to the left and the Y direction is set to be the axial direction of the circle, and the Z direction is perpendicular to the X axis in the circle.

Based on the transmission system in the reducer, the transmission system model is built by using Romax software, and the load data of the transmission system is obtained by Romax software.

As a further optimization scheme, in S1, the method for obtaining the load data comprises following steps:

S101, applying working condition data to the transmission system model;

S102, performing a statics analysis on the transmission system model, and obtaining component forces of the transmission system in the X, Y and Z directions acting on a center position of each of bearings under the working condition data based on the coordinate system; and S103, based on the box body two-dimensional unit finite element model, solving a modal and a natural frequency, compared with a modal and a natural frequency of the initial structure model of the combined box body, and correcting the box body two-dimensional unit finite element model to obtain the corrected box body two-dimensional unit finite element model.

The working condition data at least includes the speed, power and load of the rated working condition.

Based on the working condition data, gear parameters and bearing model parameters of the transmission system where the combined box body of large reducer is located, a three-dimensional model of the transmission system is constructed. According to the rated working condition, the input speed, power and load thrust of the rated working condition are added to the model to complete the detailed design of the gear, so as to ensure that the gear teeth do not interfere and may mesh normally. Then, Romax static analysis is carried out, and the component forces of the bearing in X, Y and Z directions are obtained.

As a further optimization scheme, in S2, n the S2, a method for obtaining the static displacement in each of the directions at the center point of each of the bearing seats of the corrected box body two-dimensional unit finite element model comprises following steps:

S201, after respectively applying the component forces of the transmission system in the X, Y and Z directions acting on the center position of each of the bearings under the working condition data to a bearing seat center of a corresponding position of the corrected box body two-dimensional unit finite element model, obtaining the static displacement value in each of the directions at the center point of each of the bearing seats of the corrected box body two-dimensional unit finite element model based on the static analysis of the corrected box body two-dimensional unit finite element model As a further optimization scheme, in S3, a construction of the primary design variables and the design responses comprises following steps:

S301, based on the corrected box body two-dimensional unit finite element model, selecting thickness variables of each part of a model as the primary design variables; and S302, based on the corrected box body two-dimensional unit finite element model, selecting the static displacement value in each of the directions at the center point of each of the bearing seats of the corrected box body two-dimensional unit finite element model and box mass as design responses.

The value of the primary design variables includes the following steps:

Based on the corrected box body two-dimensional unit finite element model, the thickness variables of each part of the model are selected as the primary design variables;

The value of the design responses includes the following steps:

Based on the corrected box body two-dimensional unit finite element model, the static displacement in X and Z directions at each of bearing seats of the model and the box mass are selected as the design responses.

In the further optimization scheme, in S4, S401, based on the primary design variables, the design responses and the corrected box body two-dimensional unit finite element model, performing a sensitivity analysis of the design responses to the primary design variables, and obtaining a sensitivity value of each of the design responses to the primary design variables; and S402, sorting the sensitivity value of the each of the design responses to the primary design variables respectively, selecting first five sensitivity values of the each of the design responses to the primary design variables after a sorting, and combining the primary design variables corresponding to the sensitivity values to form the design variables of the static stiffness matching optimization of the combined box body.

Figure 8:
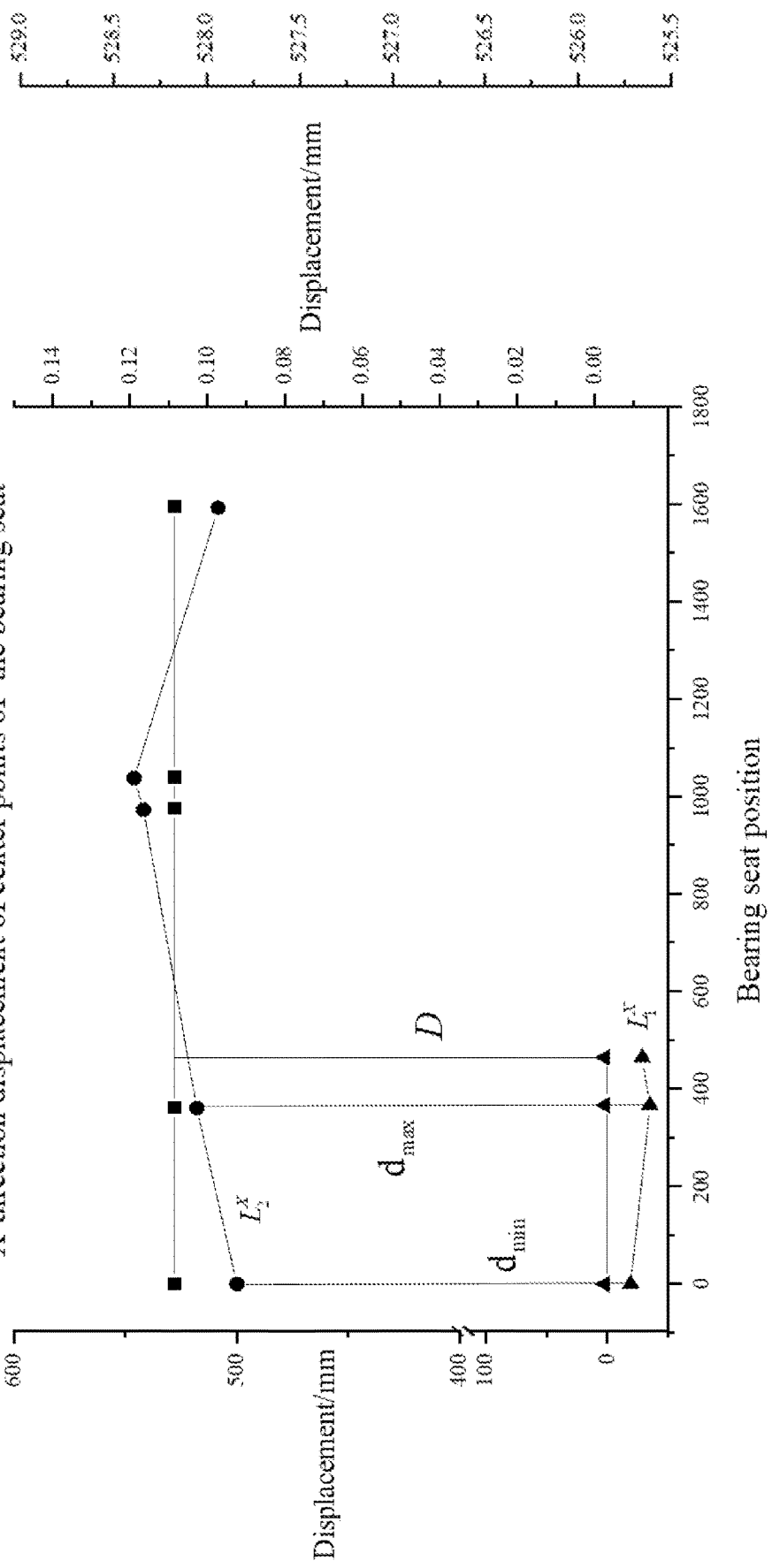
FIG. 8 is a schematic diagram of the displacement of the center point in the x direction of the present application.

As a further optimization scheme, in S5, constructing the static stiffness matching target of the combined box body comprises following steps:

S501, based on the corrected box body two-dimensional unit finite element model, setting a cartesian coordinate system, constructing a broken line $L_1^x$ in an X direction connecting the center point of each of the bearing seats of an input shaft of a transmission system, and constructing a broken line $L_1^z$ in a Z direction connecting the center point of each of the bearing seats of the input shaft of the transmission system; constructing a broken line $L_2^x$ in the X direction connecting the center point of each of the bearing seats on an intermediate shaft and an output shaft of the transmission system, and constructing a broken line $L_2^z$ in the Z direction connecting the center point of each of the bearing seats on the intermediate shaft and the output shaft of the transmission system;

S502, based on the initial structure model of the combined box body, obtaining nominal distances $D^x$ and $D^z$ among the input shaft, the intermediate shaft and the output shaft in the X direction and the Z direction in a nominal design state of the transmission system; and S503, based on a static displacement value in each of the directions at the center point of each of the bearing seats of the corrected box body two-dimensional unit finite element model, obtaining a minimum distance $d_{min}^x$ and a maximum distance $d_{max}^x$ between the two broken lines $L_1^x$ and $L_2^x$, and obtaining a minimum distance $d_{min}^z$ and a maximum distance $d_{max}^z$ between the two broken lines $L_1^z$ and $L_2^z$;

the static stiffness matching target of the combined box body are constructed as follows:

$L_1^x//L_2^x$ $L_1^x//L_2^x$ $d_{min}^x \geq 0.8D^x, d_{max}^x \leq 1.2D^x$ $d_{min}^z \geq 0.8D^z, d_{max}^z \leq 1.2D^z$ As shown in FIG. 8, the broken line refers to the broken line formed by connecting the center points of each of bearing seats in Cartesian coordinate system.

As a further optimization scheme, in S6, a construction of the objective function comprises following steps:

S601, based on the static stiffness matching target of the combined box body, converting $L_1^x//L_2^x$ in the static stiffness matching target of the combined box body into a weighted sum of absolute values of a maximum static displacement in the design responses on the input shaft, the intermediate shaft and the output shaft in a minimum X direction; converting $L_1^z//L_2^z$ in the static stiffness matching target of the combined box body into a weighted sum of the absolute values of a maximum static displacement in the design responses on the input shaft, the intermediate shaft and the output shaft in a minimum Z direction; forming the two weighted sums of the absolute values into the two objective functions;

S602, based on proportional values of the absolute values of the maximum static displacement in each of the design responses on the input shaft, the intermediate shaft and the output shaft in the X direction, and setting a sum of weighting coefficients as 1, and setting each of the weighting coefficients according to a proportional relationship; and S603, based on proportional values of the absolute values of the maximum static displacement in each of the design responses on the input shaft, the intermediate shaft and the output shaft in the Z direction, and setting a sum of weighting coefficients as 1, and setting each of the weighting coefficients according to the proportional relationship.

As a further optimization scheme, in S7, a construction of the constraint conditions comprises following steps:

S701, based on the design variables of the static stiffness matching optimization of the combined box body, constructing a change range constraint of the design variables of the static stiffness matching optimization of the combined box body to obtain a design variable constraint;

S702, based on $d_{min}^x \geq 0.8D^x$, $d_{max}^x \leq 1.2D^x$, $d_{min}^z \geq 0.8D^z$, $d_{max}^z \leq 1.2D^z$ in the static stiffness matching target of the combined box body, extracting the design responses related to the objective function except the objective function, and constructing a design response threshold constraint; constructing other design response threshold constraints based on the static stiffness matching target $L_1^x//L_2^x$ and $L_1^z/L_2^z$ of the combined box body;

S703, based on mass of the corrected box body two-dimensional unit finite element model, obtaining a mass design response constraint by setting a mass threshold; and S704, taking the mass design response constraint, the design variable constraint and the design response threshold constraint as the constraint conditions.

The construction of constraint conditions includes the following steps:

based on design variables, constructing the design variable constraints;

based on the mass of the two-dimensional unit finite element model of the combined box body, obtaining the mass design response constraint by setting the mass threshold.

Furthermore, the above design variables may also be the thickness of the corrected box body two-dimensional unit finite element model.

The constraint value of the design variables, on the one hand, needs to consider the possibility of box casting, on the other hand, on the other hand, needs to leave enough scope for optimization to achieve better optimization results.

Based on the displacement in each of the directions at the center point of each of bearing seats of the box body two-dimensional unit finite element model, the displacement constraint is obtained by setting the displacement threshold;

The displacement constraint is a part of the design response constraint, and the design responses include the mass of the box body two-dimensional unit finite element model and the static displacement in each of the directions at the center point of each of bearing seats of the box body two-dimensional unit finite element model.

As a further optimization scheme, in S7, a method for constructing the response surface proxy model comprises following steps:

S711, based on the design variables of the static stiffness matching optimization of the combined box body, constructing sampling samples by using a Latin hypercube sampling method;

S712, based on the sampled samples and the corrected box body two-dimensional unit finite element model, performing a static stiffness analysis to obtain design response values;

S713, based on the sampling samples and the design response values, constructing the response surface proxy model of the design variables and the design responses by using a least square method; and S714, performing an accuracy test by a fitting optimization index method, and obtaining a feasible response surface proxy model.

Based on the primary design variables, design responses and the box body two-dimensional unit finite element model, the sensitivity analysis of design responses to the primary design variables is carried out to obtain the sensitivity value of each design response to the primary design variables;

The sensitivity value of each response to the primary design variables are sirted respectively, the first five sensitivity values of each sorted design response to the primary design variables are selected, and taking the design variables corresponding to these sensitivity values into a set to form a design variable.

Further, the obtaining of the response surface proxy model includes the following steps:

based on the design variables, constructing a sampling sample by using a Latin hypercube sampling method;

based on the sampling samples and the corrected box body two-dimensional unit finite element model, performing a static stiffness analysis to obtain design response values;

based on sampling samples and design response values, constructing the response surface proxy model of design variables and design responses by the least square method;

performing an accuracy test by a fitting optimization index method, and obtaining a feasible response surface proxy model.

Further, the obtaining of the optimization model of the box structure includes the following steps: comparing the two-dimensional model with the three-dimensional model based on the initial structure model of the box to verify the correctness. Based on the box body two-dimensional unit finite element model, the mass of the box body two-dimensional unit finite element model is obtained, and the optimization model of the box structure is constructed by combining the displacement of the center point of each of bearing seats of the box body two-dimensional unit finite element model.

Further, the obtaining of the optimal structure model of the box body includes the following steps:

based on the design variables, sensitivity analysis is carried out to construct a fitting response surface; based on the fitting response surface, multi-objective genetic algorithm is used for optimization to obtain the optimal design variables; based on the optimal design variables, the optimal structure model of the combined box body is obtained; static analysis is carried out on the optimal structure model of the combined box body, and the results are compared with the static analysis results of the box body two-dimensional unit finite element model to confirm the optimization effects.

Embodiment 2

Referring to FIGS. 2-10, this embodiment is an application example of Embodiment 1.

As shown in FIGS. 2-5, the reducer box includes first box body side plate 1, first box body 2 and second box body 3. first box body 2 and second box body 3 are fixedly connected by bolts, and first box body side plate 1 is fixedly connected to the side of first box body 2 far away from second box body 3.

The first box body side plate 1 is provided with an input shaft No. 1 bearing seat 4 and an intermediate shaft No. 1 bearing seat 5. The first box body 2 is provided with an input shaft No. 2 bearing seat 6 and an intermediate shaft No. 2 bearing seat 7. The input shaft No. 1 bearing seat 4 corresponds to input shaft No. 2 bearing seat 6, and intermediate shaft No. 1 bearing seat 5 corresponds to intermediate shaft No. 2 bearing seat 7.

The left and right sides of the first box body 2 are symmetrically provided with first box body supporting 10. The outer surface of the first box body 2 is provided with first box body longitudinal stiffeners 8 and first box body circumferential stiffeners 9 which are crossed. The side of the first box body 2 far away from the first box body side plate 1 is in contact with the second box body 3 through the contact surface of the first box body and second box body 11.

The upper part and the middle part of the outer side of the second box body 3 are respectively provided with the input shaft No. 3 bearing seat 14 and the output shaft No. 3 bearing seat 16. Two ends of the outer side of the second box body 3 are symmetrically provided with second box body supports 12. The outer surface of the second box body 3 is provided with second box body circumferential stiffeners 13 and second box body ribbed plates 15 which are crossed. An output shaft No. 1 bearing seat 17 and an output shaft No. 2 bearing seat 18 are arranged in the second box body 3.

(1) With the help of Romax software, based on the gear structure and bearing model parameters of the transmission system, a three-dimensional model of the transmission system is constructed. Based on the three-dimensional model of the transmission system, the initial structure model of the box body including the first box body side plate 1, the first box body 2 and the second box body 3 is constructed.

Considering the rated working conditions, the input speed, power and load are set, and the static analysis is carried out with the help of Romax software, and the static loads of the transmission system acting on the input shaft No. 1 bearing seat 4, the intermediate shaft No. 1 bearing seat 5, the input shaft No. 2 bearing seat 6, the intermediate shaft No. 2 bearing seat 7, the input shaft No. 3 bearing seat 14, the output shaft No. 3 bearing seat 16, the output shaft No. 1 bearing seat 17 and the output shaft No. 2 bearing seat 18 in X, Y and Z directions are obtained.

(2) A box body two-dimensional finite element model is built, including the first box body side plate 1, first box body 2 and second box body 3.

Based on the two-dimensional unit finite element model of the combined box body, the modes and natural frequencies are solved, compared with the modes and natural frequencies of the initial structure model of the box body, the two-dimensional unit finite element model of the initial structure model of the box body is corrected, and the initial thickness of each part is given.

The thickness of each part includes the thicknesses of first box body side plate 1, first box body 2, second box body 3, first box body longitudinal stiffener 8, first box body circumferential stiffener 9, first box body support 10, second box body support 12, second box body circumferential stiffener 13, second box body ribbed plate 15 and the bearing seat.

(3) Based on the load data and the box body two-dimensional unit finite element model, static analysis is carried out to obtain the static displacement in each of the directions at the center point of each of bearing seats of the box body two-dimensional unit finite element model.

(4) The optimal structure model of the box body is built, which may be described as formulas 1:

find: $h_i = 1, 2, \ldots, n$ $$\min: \left( \sum A_1 |S_x^{max}|, \sum A_2 |S_z^{max}| \right)$$

subject to: $S_x^L \leq S_x \leq S_x^u$ $S_z^L \geq S_z \geq S_z^u$ $m_{opt} \geq m_{nor}$ $0.5 h_{nor} \leq h \leq 1.5 h_{nor}$ where $h_i$ is the design variable and the selected box structure thickness; $S_x^{max}$ and $S_z^{max}$ respectively indicate the displacements with the maximum absolute value of the center point of the bearing seats of the input shaft, the intermediate shaft and the output shaft in the X and Z directions under the static load; $A_1$ and $A_2$ respectively represent the weighted coefficient vectors of the maximum displacement of the absolute value of the center point of the bearing seat in the X and Z directions; $S_x$ and $S_z$ respectively represent the displacements in the X and Z directions at the center point of each of bearing seats except the optimization target; $S_x^L$ and $S_z^L$ respectively represent the displacement lower limits of each of bearing seats in X and Z directions under the set static load; $S_x^u$ and $S_z^u$ respectively represent the displacement upper limits in X and Z directions under the set static load; $m_{nor}$ and $m_{opt}$ respectively represent the mass of reducer box before and after optimization; $h_{nor}$ represents the initial thickness of the design variable.

Figure 7:
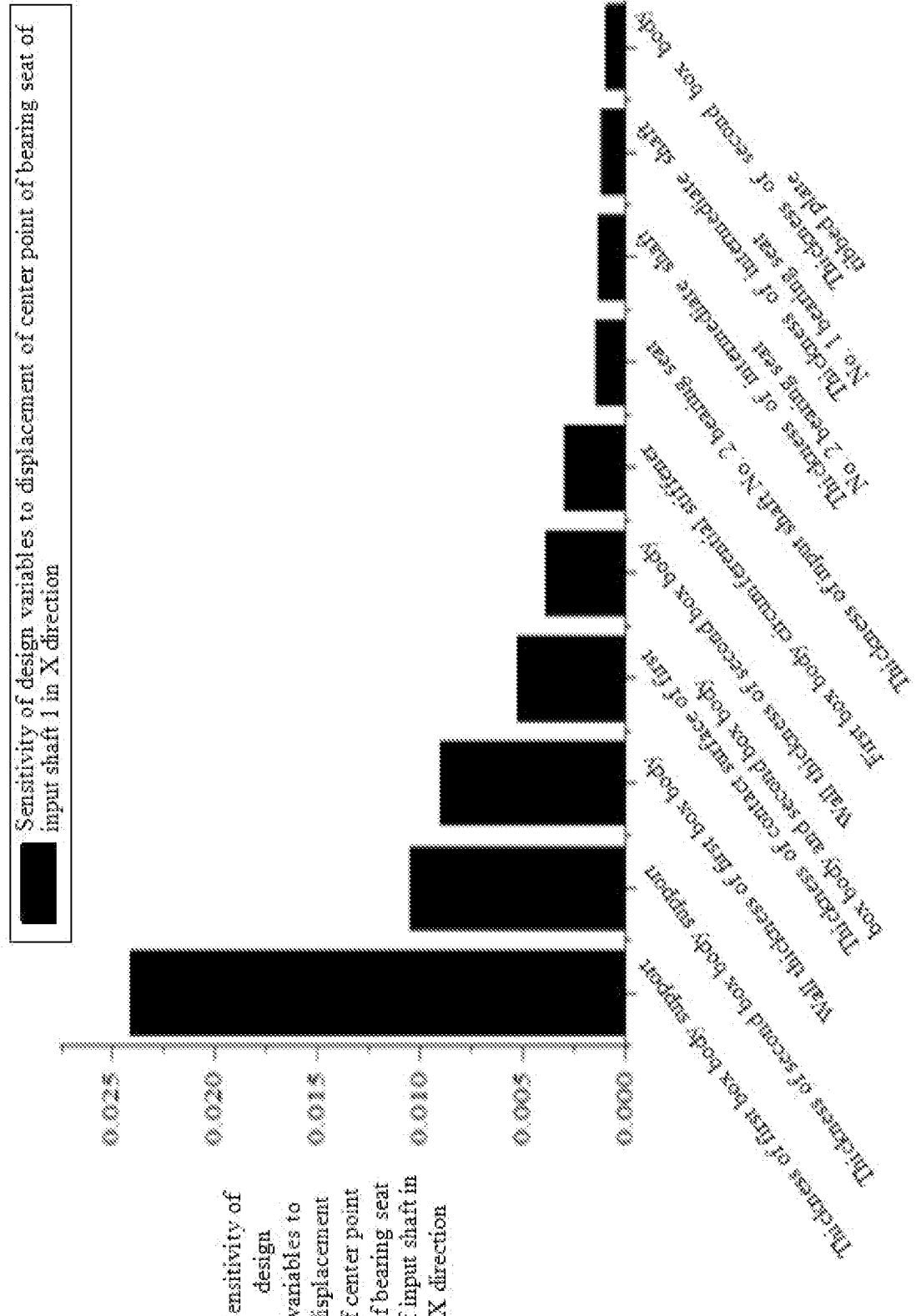
FIG. 7 is a histogram showing the sensitivity of displacement in the X direction at the input shaft No. 1 bearing seat to the design variables.

(5) Constructing the static stiffness matching design model of the combined box body expressed by formulas 1, including the following steps:

① Determining the design variables. Primary selection of first box body side plate 1, first box body 2, second box body 3, first box body longitudinal stiffener 8, first box body circumferential stiffener 9, first box body support 10, second box body support 12, second box body circumferential stiffener 13, second box body ribbed plate 15, input shaft No. 1 bearing seat 4, intermediate shaft No. 1 bearing seat 5, input shaft No. 2 bearing seat 6, intermediate shaft No. 2 bearing seat 7, input shaft No. 3 bearing seat 14 and output shaft No. 3 No. 3 bearing seat 16, the output shaft No. 1 bearing seat 17 and output shaft No. 2 bearing seat 18 are primary design variables, and the variation range of the primary design variables is $0.5 h_{nor} \leq h \leq 1.5 h_{nor}$; the X-direction static displacement and Z-direction static displacement at the center point of each of bearing seats of the box body two-dimensional unit finite element model under static load and the mass of the box body two-dimensional unit finite element model is selected as the design responses; the sensitivity analysis of design responses to primary design variables is carried out, and the sensitivity value of each design response to primary design variables are obtained. The sensitivity of static displacement in X direction of each of bearing seats to each primary design variable is shown in FIG. 7.

According to the sorting results of sensitivity values, 14 thicknesses which have great influence on the design response are selected from 17 primary design variables as static stiffness matching optimization design variables, as shown in Table 1.

TABLE 1

Design variables

| NO. | Design variable (thickness) required for static stiffness matching |
|---|---|
| 1 | Wall thickness of first box body support |
| 2 | Thickness of first box body side plate |
| 3 | Wall thickness of second box body support |
| 4 | Wall thickness of second box body |
| 5 | Thickness of first box body circumferential stiffener |
| 6 | Thickness of input shaft No. 1 bearing seat |
| 7 | Wall thickness of first box body |
| 8 | Thickness of contact surface of first box body and second box body |
| 9 | Thickness of intermediate shaft No. 1 bearing seat |
| 10 | Thickness of intermediate shaft No. 2 bearing seat |
| 11 | Thickness of second box body ribbed plate |
| 12 | Thickness of output shaft No. 1 bearing seat and output shaft No. 2 bearing seat |
| 13 | Thickness of second box body circumferential stiffener |
| 14 | Thickness of first box body longitudinal stiffener |

② Constructing the Optimal Structure Model of the Box Body with the Relationship Between Design Responses and Design Variables Latin hypercube sampling method is used to sample 14 design variables at 9 levels, and 136 samples are obtained. The static stiffness of the optimized structure models of the box body corresponding to 136 samples are analyzed respectively, and the corresponding design responses are obtained; the design responses are displacements of the center points of input shaft No. 1 bearing seat 4, input shaft No. 2 bearing seat 6, input shaft No. 3 bearing seat 14, intermediate shaft No. 1 bearing seat 5, intermediate shaft No. 2 bearing seat 7, output shaft No. 1 bearing seat 17, output shaft No. 2 bearing seat 18, output shaft No. 3 bearing seat 16 and the mass of the optimized structure model of the box body; based on the sampling samples and corresponding design response values, the linear response surface model of design variables and design responses is constructed by least square method; the method of fitting goodness index is used to test the accuracy, and the final box structure optimization design proxy model is obtained. The fitting response surface proxy model of the displacement of the center point of the input shaft No. 1 bearing seat and the design variables such as the thickness of the first box body support 10, the second box body support 12, the thickness of the first box body side plate 1, the thickness of the first box body circumferential stiffener 9 and the wall thickness of the first box body 2 is shown in formula 2.

$$f(s_{1x}^{in}) = -0.0653 + (0.00206 \cdot h_1) + (4.43e^{-4} \cdot h_2) + (-4.19e^{-4} \cdot h_3) +$$
$$(2.65e^{-4} \cdot h_4) + (3.15e^{-5} \cdot h_5) + (-1.62e^{-5} \cdot h_1^2) + (-6.28e^{-6} \cdot h_1 * h_2)$$

$h_1$: thickness of first box body support 10; $h_2$: thickness of second box body support 12; $h_3$: thickness of first box body side plate 1; $h_4$: thickness of first box body circumferential stiffener 9; $h_5$: wall thickness of first box body 2.

③ Construction of Static Stiffness Matching Target

In order to realize the deformation coordination between first box body and second box body of reducer combined box body, and construct the static stiffness matching target of box body, the steps are as follows:

1) Applying the static load of each of bearing seats under rated working conditions, and the connecting lines of the center points of each of bearing seats of the input shaft form a broken line, which is denoted as $L_1^x$ in the X direction and $L_1^z$ in the Z direction. The connecting lines of the center points of bearing seats of the intermediate shaft and the output shaft form a broken line, and the broken line formed in the X direction is denoted as $L_2^x$, and the broken line formed in the Z direction is denoted as $L_2^z$. The connecting lines of the center points of each bearing in the X and Z directions are mainly considered.

2) For the X and Z directions, making the broken line connecting the center points of each of bearing seats of the input shaft as straight as possible; making the broken line connecting the center points of the bearing seats of the intermediate shaft and the output shaft as straight as possible; the above two straight lines tend to be parallel as far as possible.

3) For the X and Z directions, the distance between the broken line connecting the center points of bearing seats of the input shaft and the broken line connecting the center points of bearing seats of the intermediate shaft and the output shaft is greater than or equal to 0.8 times the distance between the ideal straight line connecting the center points of bearing seats of the input shaft and the ideal straight line connecting the center points of bearing seats of the intermediate shaft and the output shaft, and less than or equal to 1.2 times the distance between the two ideal straight lines. The minimum distance between two broken lines is $d_{min}$, the maximum distance is $d_{max}$, the distance between ideal straight lines is D, and the displacement of the center point in the X direction is shown in FIG. 6, and the Z direction is the same as the X direction. As shown in formulas 3:

$$L_1^x // L_2^x$$

$$L_1^z // L_2^x$$

$$d_{min} \geq 0.8D$$

$$d_{max} \leq 1.2D$$

④ the Static Stiffness Matching Target is Transformed into Design Target and Design Constraint Considering the actual situation, the two broken lines may not be optimized to become ideal straight lines, and the matching target is transformed into an executable design target. In order to achieve the static stiffness matching target, firstly, the maximum absolute value of displacement of the center points of the bearing seat of the input shaft, the center points of the bearing seat of the intermediate shaft and the center points of the bearing seat of the output shaft are taken, and the weighting coefficient is determined according to the maximum displacement absolute value to minimize the weighted sum of the maximum absolute value of displacement. The value of the weighting coefficient is determined as follows: firstly, the ratio of the weighting coefficient in the X or Z direction is determined, which comes from the ratio of the maximum absolute value of displacement of the center point of the bearing seat of the input shaft, the maximum absolute value of displacement of the center point of the bearing seat of the intermediate shaft and the maximum absolute value of displacement of the center point of the bearing seat of the output shaft in the X or Z direction. Then the sum of the weighting coefficients is set to be 1, and the value of each weighting coefficient is determined by the proportion.

The optimization target is expressed as formulas 4:

$$\min(a_1 |s_{2x}^{in}| + a_2 |s_{1x}^{mi}| + a_3 |s_{1x}^{out}|)$$
$$\min(a_4 |s_{3z}^{in}| + a_5 |s_{2z}^{mi}| + a_6 |s_{3z}^{out}|)$$
$$a_1:a_2:a_3 = |s_{2x}^{in}|:|s_{1x}^{mi}|:|s_{1x}^{out}| = 0.6:0.24:0.16$$
$$a_4:a_5:a_6 = |s_{3z}^{in}|:|s_{2z}^{mi}|:|s_{3z}^{out}| = 0.14:0.20:0.66$$

$s_{2x}^{in}$, $s_{1x}^{mi}$, $s_{1x}^{out}$ respectively represent the displacements of the center points of input shaft No. 2 bearing seat 6, intermediate shaft No. 1 bearing seat 5, and output shaft No. 1 bearing seat 17 in the X direction; $a_1$, $a_2$ and $a_3$ respectively represent the weighting coefficient of the displacements of the center points of the bearing seats in the X direction; $s_{3z}^{in}$, $s_{2z}^{mi}$, $s_{3z}^{out}$ respectively represent the displacements in the Z direction of the center points of input shaft No. 3 bearing seat 14, intermediate shaft No. 2 bearing seat 7 and output shaft No. 3 bearing seat 16; $a_4$, $a_5$ and $a_6$ respectively represent the displacement weighting coefficient in the Z direction of the center points of the bearing seats.

⑤ Construction of Displacement Constraint Conditions

In the actual implementation process, two broken lines may not be optimized into two parallel straight lines. In order to achieve the optimization target as far as possible, the displacements of the center points of the bearing seats except optimization is limited to a certain range; the construction method of constraint conditions is as follows: the displacement of the center point of the combined box body bearing seat is obtained by means of statics analysis with Hyperworks, the upper and lower limits of the displacement are set, and the displacement constraint is limited within ±80% of the nominal value, so that the displacement constraint may meet the static stiffness matching target. The construction of optimization constraint is shown in formulas 5:

$$\text{subject to.:} s_{1x}^L \leq s_{1x}^{in} \leq s_{1x}^U$$
$$s_{3x}^L \leq s_{3x}^{in} \leq s_{3x}^U$$
$$s_{5x}^L \leq s_{2x}^{mi} \leq s_{5x}^U$$
$$s_{7x}^L \leq s_{2x}^{out} \leq s_{7x}^U$$
$$s_{8x}^L \leq s_{3x}^{out} \leq s_{8x}^U$$

-continued $$s_{1z}^L \leq s_{1z}^{in} \leq s_{1z}^U$$

$$s_{2z}^L \leq s_{2z}^{in} \leq s_{2z}^U$$

$$s_{4z}^L \leq s_{1z}^{mi} \leq s_{4z}^U$$

$$s_{6z}^L \leq s_{1z}^{out} \leq s_{6z}^U$$

$$s_{7z}^L \leq s_{2z}^{out} \leq s_{7z}^U$$

$s_{1x}^{in}$, $s_{3x}^{in}$, $s_{2x}^{mi}$, $s_{2x}^{out}$, $s_{3x}^{out}$ respectively represent the displacements in the X direction of the center point of input shaft No. 1 bearing seat 4, input shaft No. 3 bearing seat 14, intermediate shaft No. 2 bearing seat 7, output shaft No. 2 bearing seat 18 and output shaft No. 3 bearing seat 16; $s_{1x}^U$, $s_{3x}^U$, $s_{5x}^U$, $s_{7x}^U$, $s_{8x}^U$ respectively represent the displacement upper limits of the center points of the bearing seats above in the X direction; $s_{1x}^L$, $s_{3x}^L$, $s_{5x}^L$, $s_{7x}^L$, $s_{8x}^L$ respectively represent the displacement lower limits of the center points of the bearing seats above in the X direction; $s_{1z}^{in}$, $s_{2z}^{in}$, $s_{1z}^{out}$, $s_{2z}^{out}$ respectively represent the Z-direction displacements of the center points of input shaft No. 1 bearing seat 4, input shaft No. 2 bearing seat 6, intermediate shaft No. 1 bearing seat 5, output shaft No. 1 bearing seat 17 and output shaft No. 2 bearing seat 18; $s_{1z}^U$, $s_{2z}^U$, $s_{4z}^U$, $s_{6z}^U$, $s_{7z}^U$ respectively represent the displacement upper limits of the center points of the bearing seats above in the Z direction; $s_{1z}^L$, $s_{2z}^L$, $s_{4z}^L$, $s_{6z}^L$, $s_{7z}^L$ respectively represent the displacement lower limits of the center points of the bearing seats above in the Z direction.

⑥ Construction of Mass Constraints

In order to realize the lightweight target of the combined reducer box body, the mass constraint of the reducer box may be considered in the optimization process. On the premise of ensuring the displacement constraint of the center point of each of bearing seats of the box body, the mass $m_{opt}$ of the optimized structure model of the box body is less than or equal to the mass $m_{nor}$ of the box body two-dimensional unit finite element model. As shown in formula 6:

$$m_{opt} \leq m_{nor}.$$

(5) Optimization Process

Based on the optimization model of formulas 1, and considering the design variables, defined constraints and optimization targets, the multi-objective genetic algorithm is used to optimize and obtain the solution set of the optimized design variables. Actually, the appropriate optimization solution may be chose according to the range of design variables and the weight of objective function, and here any group of optimization solutions is chose. Because there are many result sets in multi-objective optimization, how to deal with these result sets and choose the best one needs to be considered. The selection of the results may be carried out from the following aspects: under the premise of meeting the optimization targets, the optimization results with smaller reducer box mass are chose. The selected optimization results are shown in Table 2.

TABLE 2

Optimization results

| Design variables (thickness) | Before optimization/ mm | After optimization/ mm | Design responses | Before optimization/ mm | After optimization/ mm |
| --- | --- | --- | --- | --- | --- |
| Thickness of first box body support 10 | 40 | 57 | X direction displacement of input shaft No. 1 bearing seat 4 | −0.0085 | −0.0057 |
| Thickness of first box body side plate 1 | 22 | 32 | X direction displacement of input shaft No. 2 bearing seat 6 | −0.021 | −0.015 |
| Thickness of second box body support 12 | 40 | 56 | X direction displacement of No. 3 bearing seat of input shaft 14 | −0.016 | −0.010 |
| Wall thickness of second box body 3 | 20 | 29 | X direction displacement of intermediate shaft No. 1 bearing seat 5 | −0.0078 | −0.0056 |
| Thickness of first box body circumferential stiffener 9 | 12 | 8 | X direction displacement of intermediate shaft No. 2 bearing seat 7 | −0.0030 | −0.0016 |
| Thickness of input shaft No. 1 bearing seat 4 | 30 | 20 | X direction displacement of output shaft No. 1 bearing seat 17 | 0.0051 | 0.0045 |
| Wall thickness of first box body 2 | 40 | 45 | X direction displacement of output shaft No. 2 bearing seat 18 | 0.0046 | 0.0038 |

TABLE 2-continued

| | Optimization results | | | | |
|---|---|---|---|---|---|
| Design variables (thickness) | Before optimization/ mm | After optimization/ mm | Design responses | Before optimization/ mm | After optimization/ mm |
| Thickness of contact surface of first box body and second box body 11 | 39 | 56 | X direction displacement of output shaft No. 3 bearing seat 16 | −0.00049 | −0.00035 |

(6) Analysis and Verification of Results

According to the optimization results obtained based on the proxy model, the structure thickness corresponding to each design variable is reset in the box body two-dimensional unit finite element model of the reducer, and the static stiffness analysis is carried out again. The static analysis results obtained are compared with the static analysis results before optimization to confirm the effectiveness of the optimization results.

Figure 9:
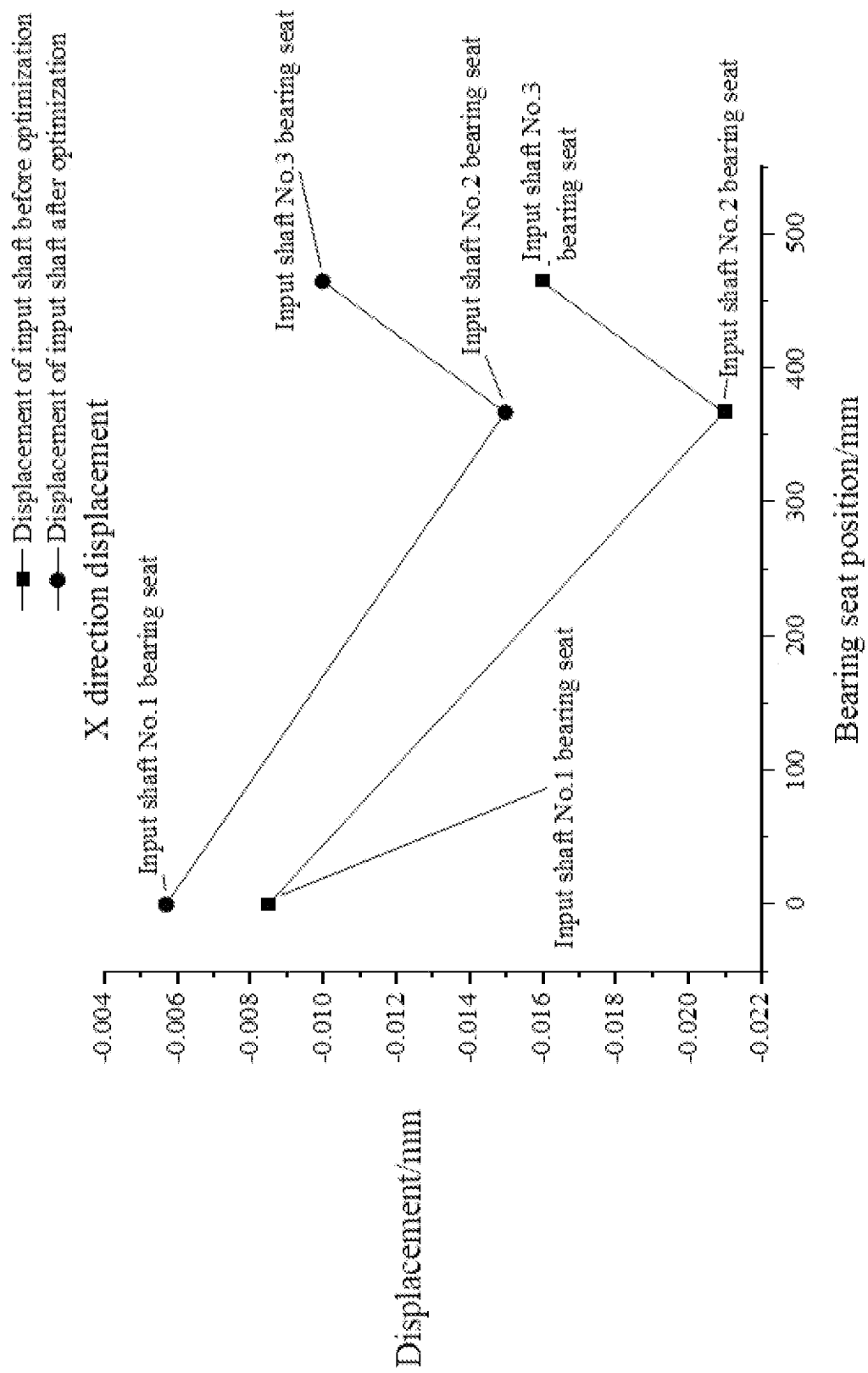
FIG. 9 is a comparative broken line chart before and after the displacement optimization of the center point of the bearing seat of the input shaft in the X-direction of the present application.
Figure 10:
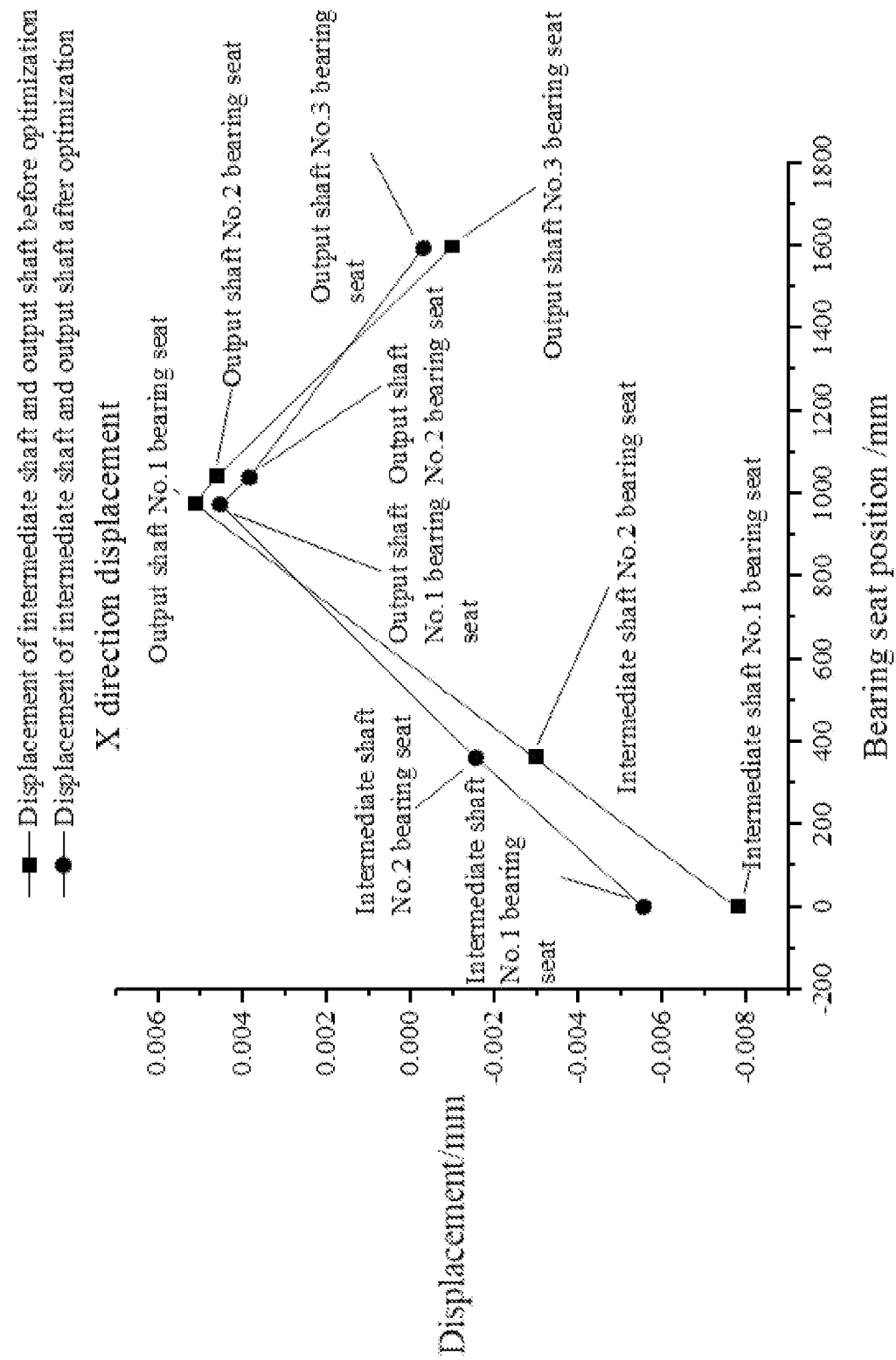
FIG. 10 is a comparative broken line chart before and after the displacement optimization of the center point of the bearing seat of the intermediate shaft and the output shaft in the X direction of the present application.

The results of static analysis before and after optimization are compared and analyzed, and the optimization effects are shown in FIG. 9 and FIG. 10. It can be seen from the figures that the static stiffness of the reducer box body is improved after optimization, and the expected target is basically achieved.

In the description of the present application, it should be understood that the orientation or positional relationships indicated by the terms "longitudinal", "transverse", "upper", "lower", "front", "rear", "left", "right", "vertical", "horizontal", "top", "bottom", "inner", "outer" are based on the orientation or positional relationship shown in the drawings are only for the convenience of describing the application, rather than indicating or implying that the device or element referred to must have a specific orientation, be constructed and operated in a specific orientation, and therefore may not be understood as a limitation to the application.

The above-mentioned embodiments only describe the preferred mode of the application, and do not limit the scope of the application. Under the premise of not departing from the design spirit of the application, various modifications and improvements made by ordinary technicians in the field to the technical scheme of the application shall fall within the protection scope determined by the claims of the application.

What is claimed is:

1. A matching design method of static stiffness for a combined box body structure of a large reducer, comprising following steps:

S1, building a transmission system model, building an initial structure model of a combined box body based on the transmission system model, building and correcting a box body two-dimensional unit finite element model based on the initial structure model of the combined box body, obtaining load data of the transmission system model, and building a coordinate system;

S2, based on the load data and a corrected box body two-dimensional unit finite element model, performing a statics analysis to obtain a static displacement in each of directions at a center point of each of bearing seats of the corrected box body two-dimensional unit finite element model;

S3, obtaining primary design variables and design responses based on the corrected box body two-dimensional unit finite element model;

S4, based on the primary design variables, constructing design variables of a static stiffness matching optimization of the combined box body;

S5, based on the static displacement in each of the directions at the center point of each of the bearing seats of the corrected box body two-dimensional unit finite element model and the initial structure model of the combined box body, constructing a static stiffness matching target of the combined box body;

S6, constructing an objective function based on the static stiffness matching target of the combined box body and the design responses;

S7, setting constraint conditions; constructing a response surface proxy model based on the design variables of the static stiffness matching optimization of the combined box body and the design responses;

S8, based on the objective function, the design variables of the static stiffness matching optimization of the combined box body, the constraint conditions and the response surface proxy model, forming a static stiffness matching optimization model of the combined box body;

S9, based on the static stiffness matching optimization model of the combined box body, adopting a multi-objective genetic algorithm to obtain an optimal design variable, and obtaining an optimal structure model of a box body based on the optimal design variable; and S10, performing the statics analysis on the optimal structure model of the box body, and performing a contrastive analysis with statics analysis results of the corrected box body two-dimensional unit finite element model to confirm optimization effects;

in the S5, constructing the static stiffness matching target of the combined box body comprises following steps:

S501, based on the corrected box body two-dimensional unit finite element model, setting a cartesian coordinate system, constructing a broken line $L_1^x$ in an X direction connecting the center point of each of the bearing seats of an input shaft of a transmission system, and constructing a broken line $L_1^z$ in a Z direction connecting the center point of each of the bearing seats of the input shaft of the transmission system; constructing a broken line $L_2^x$ in the X direction connecting the center point of each of the bearing seats on an intermediate shaft and an output shaft of the transmission system, and constructing a broken line $L_2^z$ in the Z direction connecting the center point of each of the bearing seats on the intermediate shaft and the output shaft of the transmission system;

S502, based on the initial structure model of the combined box body, obtaining nominal distances $D^x$ and $D^z$ among the input shaft, the intermediate shaft and the output shaft in the X direction and the Z direction in a nominal design state of the transmission system; and S503, based on a static displacement value in each of the directions at the center point of each of the bearing seats of the corrected box body two-dimensional unit finite element model, obtaining a minimum distance $d_{min}^x$ in and a maximum distance $d_{max}^x$ between the two broken lines $L_1^x$ and $L_2^x$, and obtaining a minimum distance $d_{min}^z$ and a maximum distance $d_{max}^z$ between the two broken lines $L_1^z$ and $L_2^z$;

the static stiffness matching target of the combined box body are constructed as follows:

$L_1^x//L_2^x$ $L_1^x//L_2^x$ $d_{min}^x \geq 0.8D^x, d_{max}^x \leq 1.2D^x$ $d_{min}^z \geq 0.8D^z, d_{max}^z \leq 1.2D^z$ in the S6, a construction of the objective function comprises following steps:

S601, based on the static stiffness matching target of the combined box body, converting $L_1^x//L_2^x$ in the static stiffness matching target of the combined box body into a weighted sum of absolute values of a maximum static displacement in the design responses on the input shaft, the intermediate shaft and the output shaft in a minimum X direction; converting $L_1^z//L_2^z$ in the static stiffness matching target of the combined box body into a weighted sum of the absolute values of a maximum static displacement in the design responses on the input shaft, the intermediate shaft and the output shaft in a minimum Z direction; forming the two weighted sums of the absolute values into the two objective functions;

S602, based on proportional values of the absolute values of the maximum static displacement in each of the design responses on the input shaft, the intermediate shaft and the output shaft in the X direction, and setting a sum of weighting coefficients as 1, and setting each of the weighting coefficients according to a proportional relationship; and S603, based on proportional values of the absolute values of the maximum static displacement in each of the design responses on the input shaft, the intermediate shaft and the output shaft in the Z direction, and setting a sum of weighting coefficients as 1, and setting each of the weighting coefficients according to the proportional relationship.

2. The matching design method of the static stiffness for the combined box body structure of the large reducer according to claim 1, wherein in the S1, a method for obtaining the load data comprises following steps:

S101, applying working condition data to the transmission system model;

S102, performing a statics analysis on the transmission system model, and obtaining component forces of the transmission system in the X, Y and Z directions acting on a center position of each of bearings under the working condition data based on the coordinate system; and S103, based on the box body two-dimensional unit finite element model, solving a modal and a natural frequency, compared with a modal and a natural frequency of the initial structure model of the combined box body, and correcting the box body two-dimensional unit finite element model to obtain the corrected box body two-dimensional unit finite element model.

3. The matching design method of the static stiffness for the combined box body structure of the large reducer according to claim 2, wherein in the S2, a method for obtaining the static displacement in each of the directions at the center point of each of the bearing seats of the corrected box body two-dimensional unit finite element model comprises following steps:

S201, after respectively applying the component forces of the transmission system in the X, Y and Z directions acting on the center position of each of the bearings under the working condition data to a bearing seat center of a corresponding position of the corrected box body two-dimensional unit finite element model, obtaining the static displacement value in each of the directions at the center point of each of the bearing seats of the corrected box body two-dimensional unit finite element model based on the static analysis of the corrected box body two-dimensional unit finite element model.

4. The matching design method of the static stiffness for the combined box body structure of the large reducer according to claim 3, wherein in the S3, a construction of the primary design variables and the design responses comprises following steps:

S301, based on the corrected box body two-dimensional unit finite element model, selecting thickness variables of each part of a model as the primary design variables; and S302, based on the corrected box body two-dimensional unit finite element model, selecting the static displacement value in each of the directions at the center point of each of the bearing seats of the corrected box body two-dimensional unit finite element model and box mass as design responses.

5. The matching design method of the static stiffness for the combined box body structure of the large reducer according to claim 1, wherein in the S4, a construction of the design variables comprises following steps:

S401, based on the primary design variables, the design responses and the corrected box body two-dimensional unit finite element model, performing a sensitivity analysis of the design responses to the primary design variables, and obtaining a sensitivity value of each of the design responses to the primary design variables; and S402, sorting the sensitivity value of the each of the design responses to the primary design variables respectively, selecting first five sensitivity values of the each of the design responses to the primary design variables after a sorting, and combining the primary design variables corresponding to the sensitivity values to form the design variables of the static stiffness matching optimization of the combined box body.

6. The matching design method of the static stiffness for the combined box body structure of the large reducer according to claim 1, wherein in the S7, a construction of the constraint conditions comprises following steps:

S701, based on the design variables of the static stiffness matching optimization of the combined box body, constructing a change range constraint of the design variables of the static stiffness matching optimization of the combined box body to obtain a design variable constraint;

S702, based on $d_{min}^x \geq 0.8D^x$, $d_{max}^x \leq 1.2D'$, $d_{min}^z \geq 0.8D^z$, $d_{max}^z \leq 1.2D^z$ in the static stiffness matching target of the combined box body, extracting the design responses related to the objective function except the objective function, and constructing a design response threshold constraint; constructing other design response threshold constraints based on the static stiffness matching target $L_1^x//L_2^x$ and $L_1^z//L_2^z$ of the combined box body;

S703, based on mass of the corrected box body two-dimensional unit finite element model, obtaining a mass design response constraint by setting a mass threshold; and S704, taking the mass design response constraint, the design variable constraint and the design response threshold constraint as the constraint conditions.

7. The matching design method of the static stiffness for the combined box body structure of the large reducer according to claim 1, wherein in the S7, a method for constructing the response surface proxy model comprises following steps:

S711, based on the design variables of the static stiffness matching optimization of the combined box body, constructing sampling samples by using a Latin hypercube sampling method;

S712, based on the sampled samples and the corrected box body two-dimensional unit finite element model, performing a static stiffness analysis to obtain design response values;

S713, based on the sampling samples and the design response values, constructing the response surface proxy model of the design variables and the design responses by using a least square method; and S714, performing an accuracy test by a fitting optimization index method, and obtaining a feasible response surface proxy model.

* * * * *